United States Patent [19]

Kogure

[11] Patent Number: 5,265,063

[45] Date of Patent: Nov. 23, 1993

[54] SEMICONDUCTOR MEMORY DEVICE HAVING A PLURALITY OF SRAMS OPERABLE IN SYNCHRONISM WITH A CLOCK PERMITTING SIMULTANEOUS ACCESS TO MULTIPLE DATA

[75] Inventor: Kanari Kogure, Tokyo, Japan

[73] Assignee: NEC Corporation, Tokyo, Japan

[21] Appl. No.: 729,738

[22] Filed: Jul. 15, 1991

[30] Foreign Application Priority Data

Jul. 16, 1990 [JP] Japan .................................. 2-188429

[51] Int. Cl.[5] .......................... G11C 8/00; H03K 19/00
[52] U.S. Cl. .................................... 365/233; 365/236; 307/480; 328/63
[58] Field of Search ........................ 365/233, 236, 239; 307/269, 480; 328/63, 72

[56] References Cited

U.S. PATENT DOCUMENTS

| | | | |
|---|---|---|---|
| 3,855,580 | 12/1974 | Lighthall | 365/233 |
| 4,503,490 | 3/1985 | Thompson | 365/233 |
| 4,829,485 | 5/1989 | Hatanaka et al. | 365/233 |
| 4,852,061 | 7/1989 | Baron et al. | 365/233 |

Primary Examiner—Timothy P. Callahan
Attorney, Agent, or Firm—Whitham & Marhoefer

[57] ABSTRACT

A semiconductor memory device having a plurality of (N) SRAMs (Static Random Access Memories). The device equally divides all of the data into N blocks and writes each of the N blocks of data in respective one the N SRAMs. In a read mode operation, the device reads different data from the N SRAMs at the same time. This is successful in reducing the chip area and current consumption.

2 Claims, 5 Drawing Sheets

SEMICONDUCTOR MEMORY DEVICE HAVING A PLURALITY OF SRAMS OPERABLE IN SYNCHRONISM WITH A CLOCK PERMITTING SIMULTANEOUS ACCESS TO MULTIPLE DATA

BACKGROUND OF THE INVENTION

The present invention relates to a semiconductor memory device having a plurality of SRAMs (Static Random Access Memories) operable in synchronism with a clock signal and, more particularly, to a semiconductor memory device which allows a plurality of data to be read thereoutof at the same time.

A conventional semiconductor memory device of the type described has a data input terminal, an address input terminal, a write enable signal input terminal, a clock input terminal, a plurality of (N) SRAMs each having a data output terminal, and N address decoders each being associated respective one of the SRAMs. To read N different data out of the memory device at the same time, it has been customary to write identical data in all of the SRAMs beforehand and to cause the address decoders to select data stored in different addresses of the SRAMs. The drawback with such a conventional memory device is that the SRAMs each needs a capacity great enough to accommodate all of the data, increasing the chip area and aggravating current consumption.

SUMMARY OF THE INVENTION

It is therefore an object of the present invention to provide a semiconductor memory device which reduces the chip area and current consumption.

It is another object of the present invention to provide a generally improved semiconductor memory device.

A semiconductor memory device having a plurality of (N) SRAMs which are operable in synchronism with a clock of the present invention comprises a clock converting circuit for converting a first clock into N second clocks which are different in phase from one another, and N selectors each being associated with respective one of the SRAMs for selecting either one of the first and second clocks in response to a write enable signal and inputting the one clock to the SRAM associated therewith.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
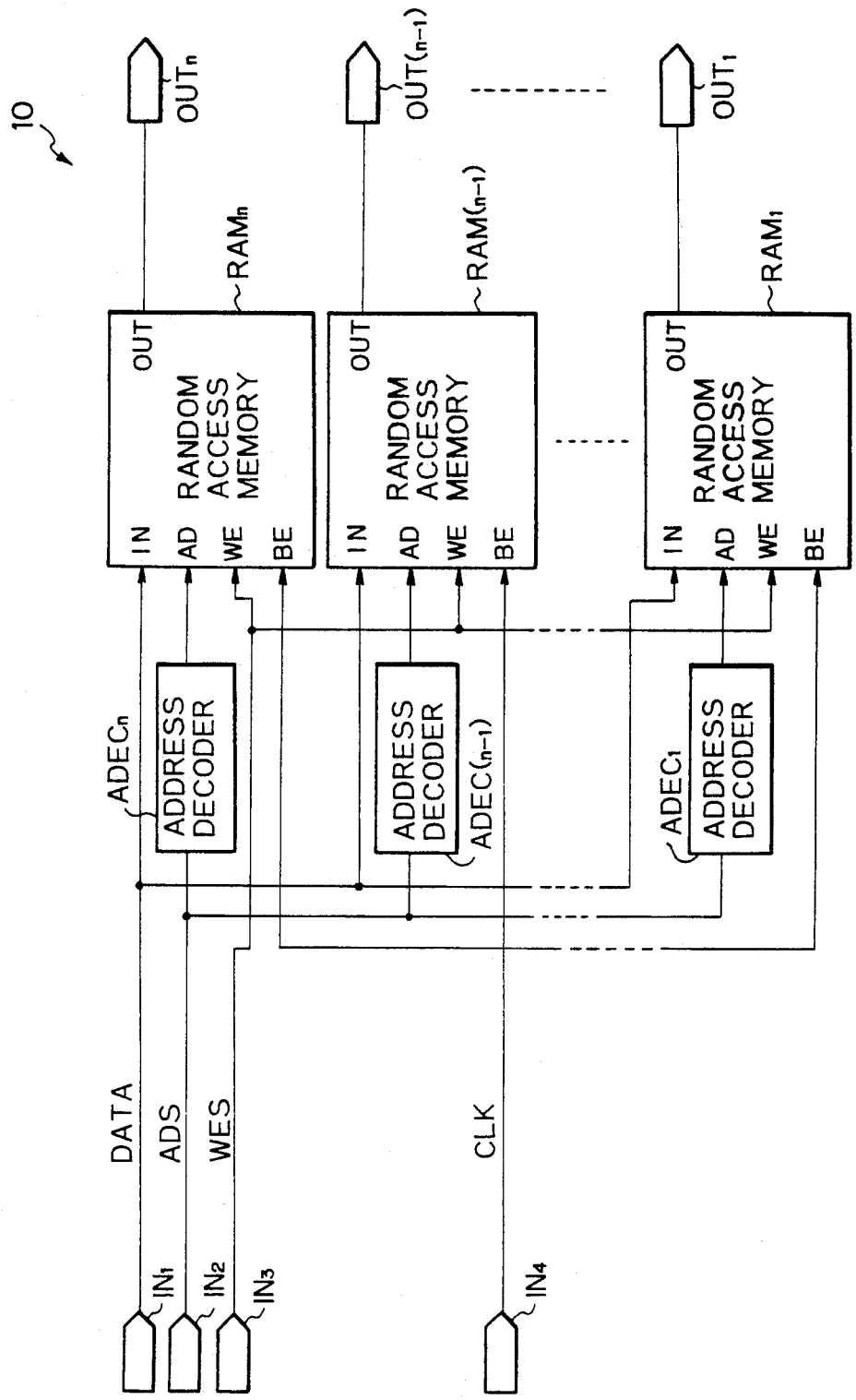
FIG. 1 is a block diagram schematically showing a conventional semiconductor memory device.

To better understand the present invention, a brief reference will be made to a prior art semiconductor memory device, shown in FIG. 1. As shown, the conventional memory device, generally 10, has a data input terminal $IN_1$, an address input terminal $IN_2$, a write enable input terminal $IN_3$, and a clock input terminal $IN_4$ assigned to data DATA, an address signal ADS, a write enable signal WES, and a clock CLK, respectively. Further, the memory device 10 has a plurality of (N) SRAMs $RAM_1$-$RAM_n$, address decoders $ADEC_1$-$ADEC_n$ each being associated with respective one of the memories $RAM_1$-$RAM_n$, and data output terminals $OUT_1$-$OUT_n$ each being connected to respective one of the memories $RAM_1$-$RAM_n$. To read N different data from such a memory device 10, it is necessary that identical data be stored in all of the memories $RAM_1$-$RAM_n$, and that data stored at different addresses be selected by the address decoders $ADEC_1$-$ADEC_n$. This brings about a problem that each of the memories $RAM_1$-$RAM_n$ has to have a capacity great enough to accommodate all of the data, resulting in the increase in chip area and current consumption.

Figure 2:
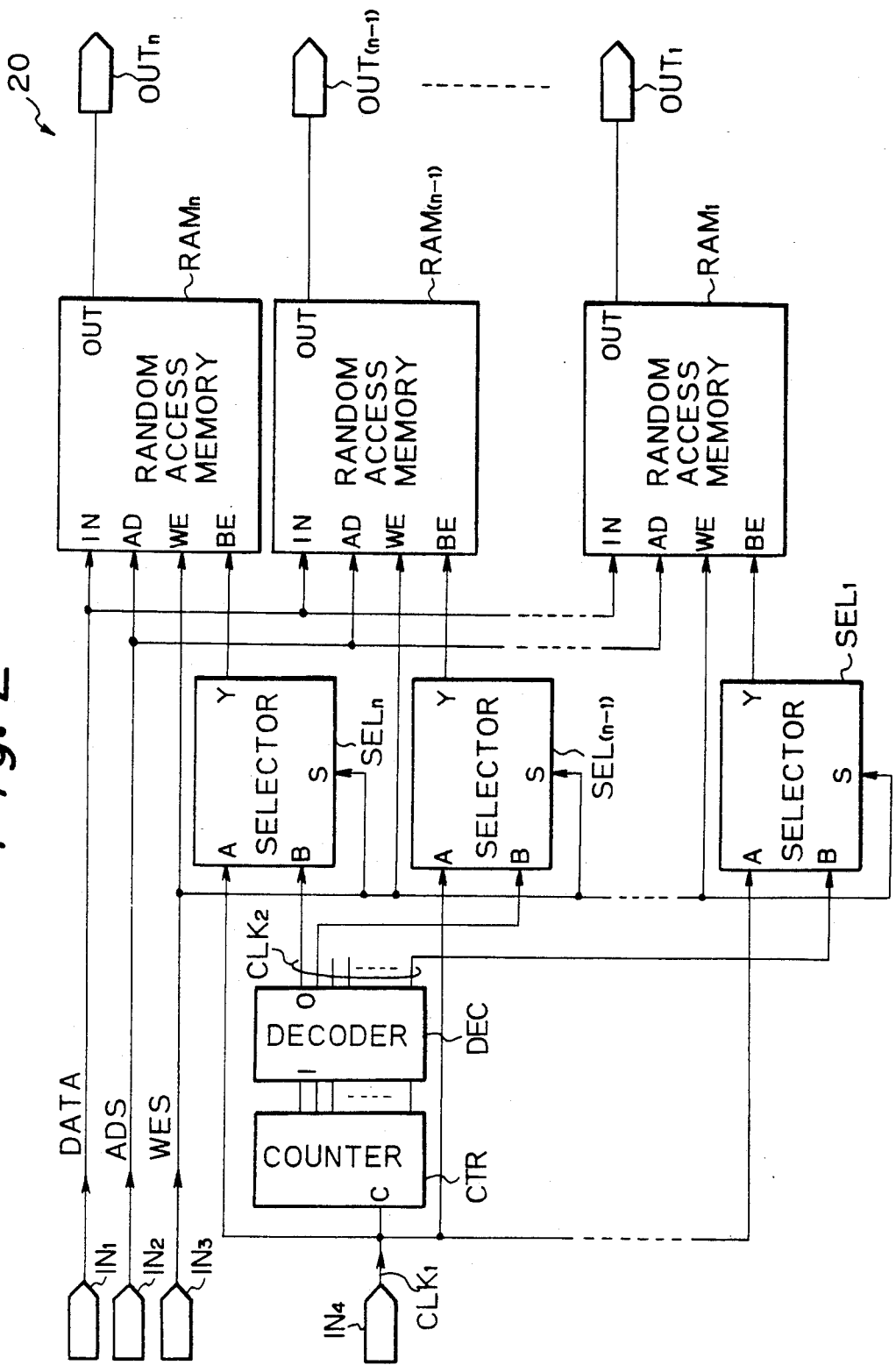
FIG. 2 is a block diagram schematically showing a semiconductor memory device embodying the present invention.

Referring to FIG. 2, a semiconductor memory device embodying the present invention is shown and generally designated by the reference numeral 20. In FIG. 2, the components functionally equivalent to the components of FIG. 1 are designated by the same reference numerals, and redundant description will be avoided for simplicity. As shown, the memory device 20, like the conventional memory device 10, has a data input terminal $IN_1$, an address input terminal $IN_2$, a write enable input terminal $IN_3$, a clock input terminal $IN_4$, a plurality of (N) SRAMs $RAM_1$-$RAM_n$, and data output terminals $OUT_1$-$OUT_n$. It is noteworthy that the memory device 20 does not have the address decoders $ADEC_1$-$ADEC_n$, FIG. 1. A first clock $CLK_1$ is applied to the clock input terminal $IN_4$ which is connected to a counter CTR. The counter CTR counts the input clock pulses $CLK_1$. A decoder DEC decodes the resultant outputs of the counter CTR to generate N second clocks $CLK_2$ having the same period which is different from the period of the first clock $CLK_1$ and different in phase from one another. The counter CTR and decoder DEC, therefore, play the role of a clock converting circuit in combination. N selecting circuits or selectors $SEL_1$-$SEL_n$ each selects either on of the first clock $CLK_1$ and associated one of the second clocks $CLK_2$ in response to a write enable signal WES. The clock signal $CLK_1$ or $CLK_2$ selected by each of the selectors $SEL_1$-$SEL_n$ is applied to the clock input terminal BE of one of SRAMS $RAM_1$-$RAM_n$ each being connected to respective one of the selectors $SEL_1$-$SEL_n$.

Figure 3:
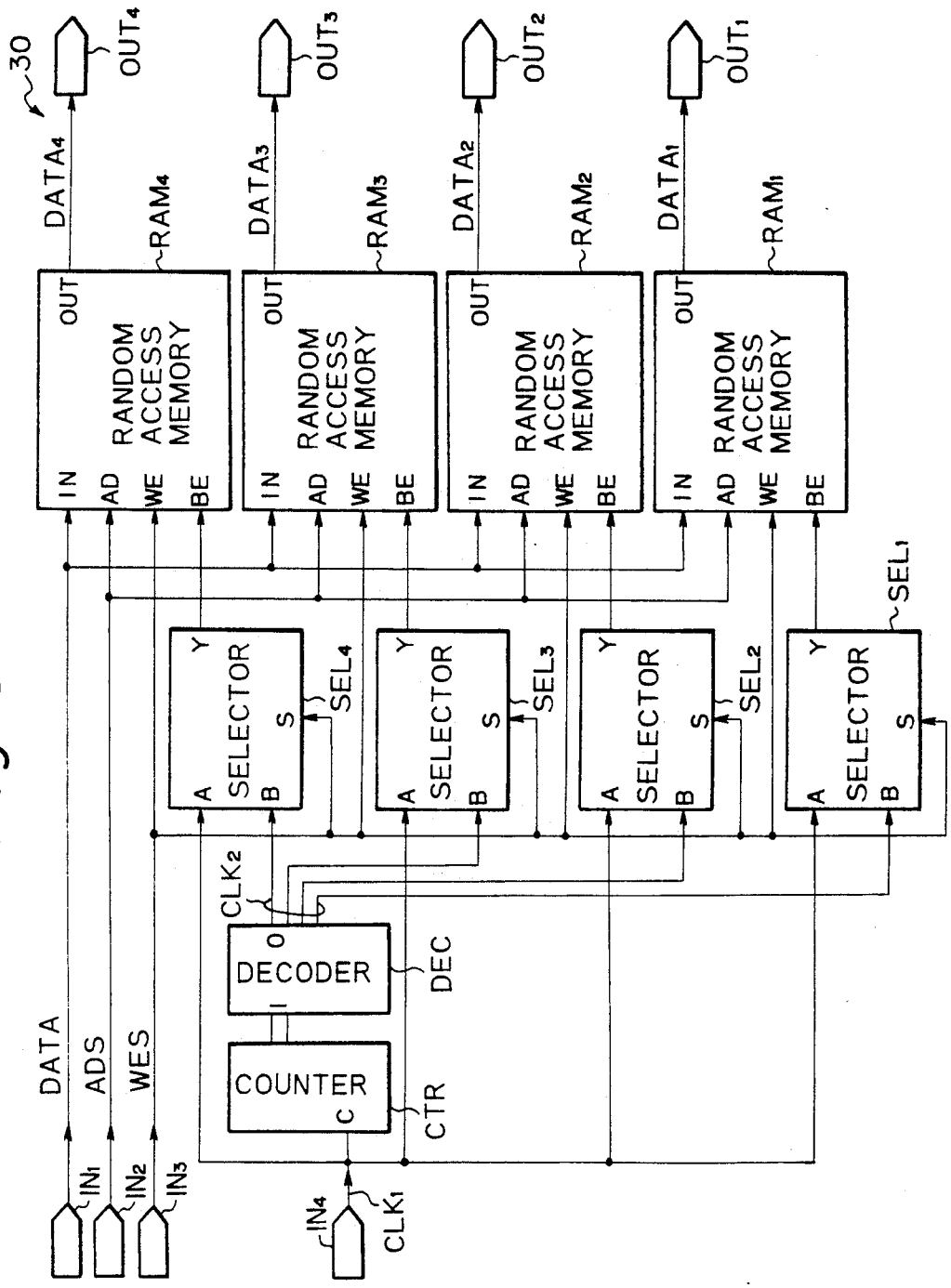
FIG. 3 is a block diagram schematically showing an alternative embodiment of the present invention.

FIG. 3 shows an alternative embodiment of the memory device in accordance with the present invention. In the figures, the same or similar components as those shown in FIG. 2 are designated by like reference numerals, and redundant description will be avoided for simplicity. As shown, the memory device, generally 30, has four SRAMs $RAM_1$-$RAM_4$, a counter CTR, and a decoder DEC. The memories $RAM_1$-$RAM_4$ each has a data input terminal IN connected to the data input terminal $IN_1$, an address terminal AD connected to the address input terminal $IN_2$, a write enable terminal WE connected to the write enable input terminal $IN_3$, and a clock terminal BE connected to the output terminal Y of associated one of the selectors $SEL_1$-$SEL_4$. The counter CTR has an input terminal C connected to the clock input terminal $IN_4$ and an output terminal connected to the input terminal I of the decoder DEC. The output terminals O of the decoder DEC each is connected to respective one of the terminals B of the selectors $SEL_1$-$SEL_4$. The input terminals A of the selectors $SEL_1$-$SEL_4$ are connected to the clock input terminal $IN_4$, while the control terminals S of the selectors $SEL_1$-$SEL_1$ are connected to the write enable input terminal $IN_3$.

The counter CTR and decoder DEC cooperate to generate second clocks $CLK_2$ which are four times longer in period than the first clock $CLK_1$ and are sequentially deviated in phase from one another by each one-fourth of the period of the first clock signal $CLK_1$. The selectors $SEL_1$-$SEL_4$ each is constructed to select associated one of the second clocks $CLK_2$ in the event of writing or the first clock $CLK_1$ in the event of reading. The address signal ADS is applied to the input terminal $IN_2$ at a period four times longer than the period of the first clock $CLK_1$.

As FIG. 3 indicates, this embodiment divides all of the data to be written in the memory device 30 into four blocks and writes each block of data in respective one of the four memories $RAM_1$-$RAM_4$, thereby allowing four different data to be read out at the same time. The operation of the memory device 30 will be described specifically with reference to FIGS. 4 and 5.

Figure 4:
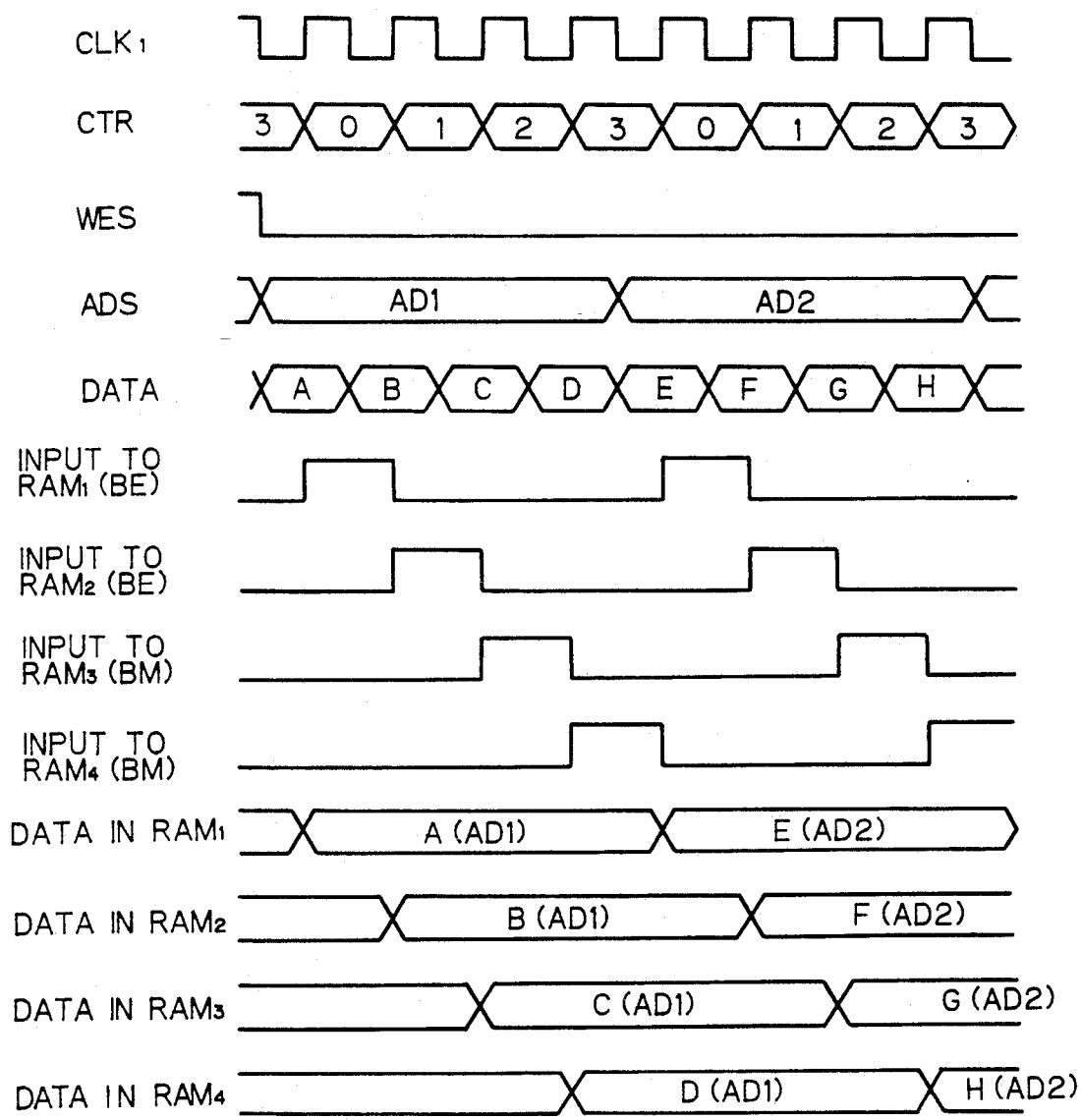
FIGS. 4 and 5 are timing charts showing respectively a specific write mode operation and a specific read mode operation particular to the embodiment of FIG. 3.

As shown in FIG. 4, in a write mode operation, addresses meant for the memories $RAM_1$-$RAM_n$ are sequentially applied to the input terminal $IN_2$ at a period four times longer than the period of the first clock $CLK_1$. On the other hand, data DATA are applied to the input terminal $IN_1$ at the same period as the first clock $CLK_1$. As a result, four different data are inputted to the memory device 30 while a single address is inputted to the same. The clock pulses applied to the memories $RAM_1$-$RAM_4$ are the outputs of the decoder DEC and, therefore, deviated in phase from one another by each ¼ period in terms of the period of the first clock $CLK_1$. As a result, data A, B, C and D shown in FIG. 4 are respectively written to the addresses AD1 of the memories $RAM_1$-$RAM_4$. In this manner, four different data are written to the same address of the memories $RAM_1$-$RAM_4$.

Figure 5:
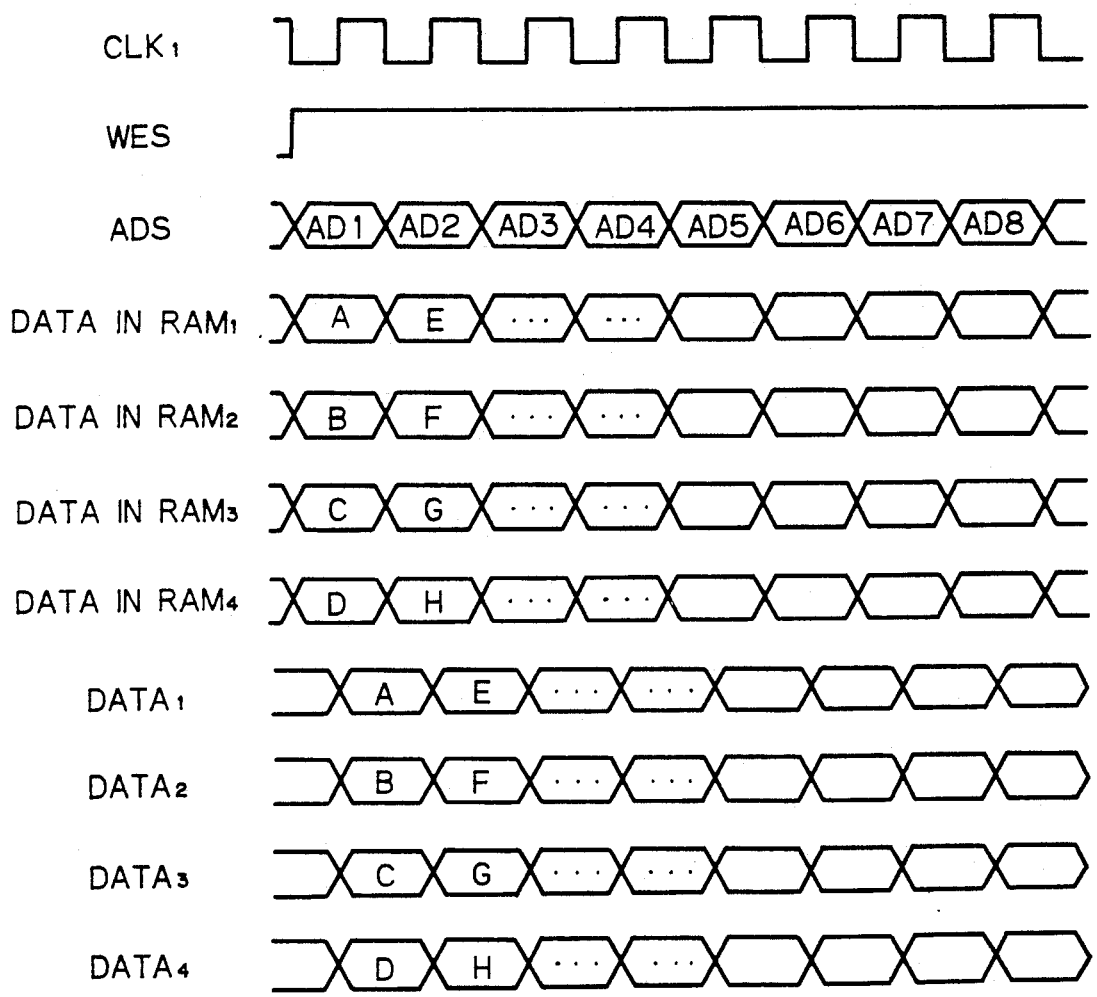

As shown in FIG. 5, in a read mode operation, the address signals ADS are inputted to the memory device 30 at the same period as the first clock $CLK_1$. In FIG. 5, when the address AD1 is selected, the data A is read out of the $RAM_1$ and fed to the output terminal $OUT_1$ as output data $DATA_1$. Likewise, the data B, C and D are respectively read out of the memories $RAM_2$-$RAM_4$ and fed to the output terminals $OUT_2$-$OUT_4$ as output data $DATA_2$-$DATA_4$. At this instant, the data A-D are read out at the same time.

As stated above, in the illustrative embodiment, one-fourth of all of the data is written to each of the memories $RAM_1$-$RAM_4$, and four different data are read out of the memories $RAM_1$-$RAM_4$ at the same time. Hence, the memories $RAM_1$-$RAM_4$ each needs a capacity which is only one-fourth of the capacity of the SRAM of the conventional memory device 10 (generally 1/N).

In summary, it will be seen that the present invention provides a semiconductor memory device which writes in each of N SRAMs 1/N of all of the desired data and reads a plurality of data out of the SRAMs at the same time. This is successful in reducing the chip area and power consumption.

Various modifications will become possible for those skilled in the art after receiving the teachings of the present disclosure without departing from the scope thereof.

What is claimed is:

1. A semiconductor memory device having a plurality of (N) SRAMs (Static Random Access Memories) which are operable in synchronism with a clock, comprising:

clock converting means for converting a first clock into N second clocks which are different in phase from one another, wherein said N second clocks have N times longer period than said first clock and are different in phase from one another by each 1/N of the period of said first clock, said clock converting means comprises a counter for counting said first clock, and a decoder for decoding the outputs of said counter to generate said N second clocks; and N selecting means each being associated with a respective one of said SRAMs for selecting either one of said first and second clocks in response to a write enable signal and inputting said one clock to said SRAM associated therewith, said N selecting means selecting said second clock in a write mode operation.

2. A semiconductor memory device having a plurality of (N) SRAMs (Static Random Access Memories) which are operable in synchronism with a clock, comprising:

clock converting means for converting a first clock into N second clocks which are different in phase from one another, wherein said N second clocks have N times longer period than said first clock and are different in phase from one another by each 1/N of the period of said first clock; and N selecting means each being associated with a respective one of said SRAMs for selecting either one of said first and second clocks in response to a write enable signal and inputting said one clock to said SRAM associated therewith, said N selecting means selecting said second clock in a write mode operation.

* * * * *